(12) United States Patent
Larisegger et al.

(10) Patent No.: US 10,937,720 B2
(45) Date of Patent: Mar. 2, 2021

(54) SEMICONDUCTOR DEVICE WITH COPPER STRUCTURE

(71) Applicant: Infineon Technologies Austria AG, Villach (AT)

(72) Inventors: Silvia Larisegger, Vienna (AT); Michael Nelhiebel, Villach (AT); Sabine Reither, Vienna (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 16/368,064

(22) Filed: Mar. 28, 2019

(65) Prior Publication Data

US 2019/0304884 A1 Oct. 3, 2019

(30) Foreign Application Priority Data

Mar. 29, 2018 (DE) .................... 10 2018 107 563.4

(51) Int. Cl.
*H01L 23/00* (2006.01)
*H01L 23/495* (2006.01)
(Continued)

(52) U.S. Cl.
CPC ........ *H01L 23/49582* (2013.01); *H01L 21/56* (2013.01); *H01L 23/564* (2013.01);
(Continued)

(58) Field of Classification Search
CPC . H01L 23/00; H01L 23/495; H01L 23/49582; H01L 2224/63825; H01L 2224/05647; H01L 23/564; H01L 23/3107; H01L 23/49586; H01L 23/49562; H01L 21/56; H01L 24/05; H01L 24/43; H01L 24/45; H01L 24/40; H01L 24/37; H01L 24/84; H01L 24/85; H01L 24/48; H01L 29/45; H01L 29/452; H01L 29/7786; H01L 29/2003; H01L 2224/02215;
(Continued)

(56) References Cited

U.S. PATENT DOCUMENTS 2,081,121 A 5/1937 Stareck
2002/0132056 A1 9/2002 Montano et al.
(Continued)

FOREIGN PATENT DOCUMENTS

DE 102012103157 A1 10/2012
DE 102016109349 A1 11/2017
(Continued)

OTHER PUBLICATIONS

Fujimoto, Kazuya, et al., "Fabrication and characterization of copper oxides/fullerene solar cells prepared by an electrodeposition method", Journal of the Ceramic Society of Japan, 119 [6], 2011, pp. 402-404.
(Continued)

*Primary Examiner* — Chuong A Luu
(74) *Attorney, Agent, or Firm* — Murphy, Bilak & Homiller, PLLC

(57) ABSTRACT

A semiconductor device includes a copper structure over a semiconductor body. In a copper oxide layer on a surface of the copper structure, a content of copper is between 60 at % and 75 at % and a content of oxygen is between 25 at % and 40 at %.

17 Claims, 4 Drawing Sheets

(51) Int. Cl.
*H01L 29/45* (2006.01)
*H01L 21/56* (2006.01)

(52) U.S. Cl.
CPC .............. *H01L 24/05* (2013.01); *H01L 24/43* (2013.01); *H01L 24/45* (2013.01); *H01L 29/452* (2013.01); *H01L 2224/02215* (2013.01); *H01L 2224/04042* (2013.01); *H01L 2224/05647* (2013.01); *H01L 2224/43825* (2013.01); *H01L 2224/45147* (2013.01); *H01L 2224/45565* (2013.01); *H01L 2224/45647* (2013.01)

(58) Field of Classification Search
CPC . H01L 2224/04042; H01L 2224/43825; H01L 2224/45147; H01L 2224/45565; H01L 2224/45647; H01L 2224/40247; H01L 2224/8492; H01L 2224/04034; H01L 2224/05568; H01L 2224/48464; H01L 2224/48247; H01L 2224/49111; H01L 2224/405; H01L 2224/37147; H01L 2224/485; H01L 2224/8592; H01L 2224/45014
USPC ........................................................ 257/288
See application file for complete search history.

(56) References Cited

U.S. PATENT DOCUMENTS

| | | |
|---|---|---|
| 2003/0230804 A1 | 12/2003 | Kouno et al. |
| 2005/0266672 A1 | 12/2005 | Jeng et al. |
| 2007/0144914 A1 | 6/2007 | Schweinsberg et al. |
| 2008/0278649 A1* | 11/2008 | Koike .................. H01L 51/105 349/42 |
| 2009/0090942 A1* | 4/2009 | Kim ...................... H01L 27/124 257/288 |
| 2009/0130837 A1* | 5/2009 | Huang .............. H01L 21/02274 438/602 |
| 2010/0155733 A1* | 6/2010 | Moon ................ G02F 1/136227 257/59 |
| 2012/0153444 A1 | 6/2012 | Haga et al. |
| 2016/0339966 A1* | 11/2016 | Iwase ...................... F16B 19/05 |

FOREIGN PATENT DOCUMENTS

| | | |
|---|---|---|
| JP | S62291123 A | 12/1987 |
| JP | 2015149370 A | 8/2015 |

OTHER PUBLICATIONS

Han, Kunhee, et al., "Electrochemically deposited p-n homojunction cuprous oxide solar cells", Solar Energy Materials & Solar Cells 93, 2009, pp. 153-157.

Lee, Yueh-Hsun, et al., "Growth characteristics of electrochemically deposited Cu2O thin film onto Pt/SiO2/Si substrate by galvanostatic technique", Electrochemical Society Proceedings, vol. 2003-32, 2006, pp. 225-228.

Mahalingam, T., et al., "Photoelectrochemical solar cell studies on electroplated cuprous oxide thin films", Journal of Materials Science: Materials in Electronics, Jul. 2006, vol. 17, Issue 7, pp. 519-523.

Nair, M.T.S., et al., "Chemically deposited copper oxide thin films: structural, optical and electrical characteristics", Applied Surface Science 150, 1999, pp. 143-151.

Rahman, A.S.M. Sayem, et al., "Electrodeposition and Characterization of Copper Oxide Thin Films for Solar cell Applications", Procedia Engineering, vol. 105, 2015, pp. 679-685.

Wang, Longcheng, "Preparation and characterization of properties of electrodeposited copper oxide films", 2006.

* cited by examiner

SEMICONDUCTOR DEVICE WITH COPPER STRUCTURE

TECHNICAL FIELD

The present disclosure relates to a semiconductor device and to methods of manufacturing a semiconductor device.

BACKGROUND

Fabrication of integrated circuits usually includes mounting a semiconductor die on a lead frame and bonding wires from bonding pads on the semiconductor die to the lead frame by a wire bonding procedure. The base material of the lead frame and/or the bond wires may be copper or a copper alloy. Alternatively or in addition, the semiconductor die may utilize thick plated copper metallization top surface layers to reduce the electric resistance of circuit interconnections. There is need to improve the reliability of semiconductor devices that use copper for the top metallization of the semiconductor die, for the bond wires and/or for the lead frame.

SUMMARY

The present disclosure relates to a semiconductor device that includes a copper structure over a semiconductor body. In a copper oxide layer on a surface of the copper structure a content of copper is between 60 at % and 75 at % and a content of oxygen is between 25 at % and 40 at %.

The copper oxide layer has a comparatively high content of cuprous oxide ($Cu_2O$). As any intrinsic metal-oxide on a metal surface, cuprous oxide on copper forms a passive layer which significantly slows down corrosion processes that may damage the copper structure. Compared to other materials, e.g., silicon oxide and/or silicon nitride, a layer from cuprous oxide is less brittle, well adhering to copper, by the method of deposition capable of covering surfaces of arbitrary orientation to the substrate, and therefore may form a more reliable anticorrosive coating.

For example, the content of cuprous oxide in the copper oxide layer may be at least 90%, wherein a copper oxide layer with a high content of cuprous oxide provides highly effective protection against corrosion. The thickness of the copper oxide layer may be at least 50 nm such that the copper oxide layer shows sufficient mechanical ruggedness and reliably covers steps of the copper structure at sufficient thickness.

The copper structure may include a wiring/pad structure on the semiconductor body, wherein the wiring/pad structure may be electrically connected to one or more first doped regions in the semiconductor body. The wiring/pad structure may include bonding areas as landing zones for the bond wires. An interlayer dielectric between the wiring/pad structure and the semiconductor body may electrically separate the copper structure from second doped regions in the semiconductor body.

The wiring/pad structure may include a top surface and a side surface, which may be tilted to the top surface. The copper oxide layer may be formed directly on the wiring/pad structure and may cover both the top surface and the side surface at uniform thickness. Portions of the copper oxide layer formed on side surfaces of adjacent wiring/pad structures may form part of a reliable barrier between the adjacent wiring/pad structures.

According to an embodiment, the copper structure may include a bond wire that electrically connects the semiconductor body with a lead. The copper oxide layer may be formed on the bond wire and may be effective as corrosion protection for the bond wire.

For example, the bond wire may include a first wire end (bond foot) that is in direct contact with the wiring/pad structure in a first section of a bonding area, a second wire end in direct contact with a lead, and a wire portion connecting the first and second wire ends. The copper oxide layer may include a portion formed in a second section of the bonding area not occupied by the wire end. According to an embodiment the copper structure may include the wiring/pad structure and the bond wire, wherein the copper oxide layer forms a continuous layer coating the bond wire and an adjoining section of the bonding area. According to an embodiment the lead may include copper and the copper oxide layer is formed on at least a first portion of the lead.

A dielectric structure directly formed on the copper oxide layer may include at least one of a reducing agent and an agent capable of forming a hydrogen-complex such that the dielectric structure forms an alkaline environment for the copper oxide layer. The alkaline environment absorbs hydrogen ions. For example, the dielectric structure may include an alkaline buffer, and/or anticorrosion pigments. By maintaining an alkaline pH, the alkaline environment stabilizes the cuprous oxide content of the copper oxide layer such that the anticorrosive effect of the copper oxide layer remains stable over a long period of time.

The dielectric structure may include, e.g., a polyimide that may be deposited on wafer level. According to another embodiment the dielectric structure may be a mold that may include an epoxy resin.

The semiconductor device may be a power semiconductor device including transistor cells electrically connected to the copper structure. The copper oxide layer with high cuprous oxide content may significantly increase reliability of copper structures formed on the semiconductor body and/or the reliability of copper interconnections between the semiconductor body and the leads and may facilitate the use of low-resistive copper for power semiconductor devices.

The present disclosure further relates to a semiconductor device that includes a copper structure over a semiconductor body and a copper oxide layer on the copper structure. The copper oxide layer includes cuprous oxide. The copper oxide layer may be in direct contact with the copper structure. A dielectric structure directly on the copper oxide layer may include at least one of a reducing agent and an agent capable of forming a hydrogen-complex.

The present disclosure further relates to a method of manufacturing a semiconductor device. A copper oxide layer is formed by electrochemical deposition on a bond wire that includes copper and that electrically connects a semiconductor die with a lead frame. A mold is formed that encapsulates the semiconductor die and the bond wire. The method provides a homogeneous, dense and thin copper oxide layer with a high content of cuprous oxide. The electrochemically deposited cuprous oxide provides reliable corrosion protection for the bond wire.

The present disclosure further relates to another method of manufacturing a semiconductor device. A copper structure is formed on a semiconductor body and a copper oxide layer is formed directly on the copper structure. In the copper oxide layer a content of copper is between 60 at % and 75 at % and a content of oxygen is between 25 at % and 40 at %. The high content of cuprous oxide provides reliable corrosion protection of copper containing metallization layers that may be formed on wafer level.

The present disclosure refers to a further method of manufacturing a semiconductor device. A copper structure is provided. A copper oxide layer is formed directly on the copper structure by electroless chemical plating. The electroless chemical plating may facilitate the formation of a homogenous and dense copper oxide layer with a high content of cuprous oxide on a plurality of electrically separated copper structures, e.g., on a wafer surface without the need to electrically contact each single of the copper structures.

BRIEF DESCRIPTION OF THE FIGURES

The accompanying drawings are included to provide a further understanding of the embodiments and are incorporated in and constitute a part of this specification. The drawings illustrate the semiconductor device and the methods of the present disclosure and together with the description serve to explain principles of the embodiments. Other embodiments and intended advantages will be readily appreciated as they become better understood by reference to the following detailed description.

DETAILED DESCRIPTION

In the following detailed description, reference is made to the accompanying drawings, which form a part hereof and in which are shown by way of illustrations specific embodiments in which the embodiments may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open and the terms indicate the presence of stated structures, elements or features but not preclude the presence of additional elements or features. The articles "a", "an" and "the" are intended to include the plural as well as the singular, unless the context clearly indicates otherwise.

Main constituents of a layer or a structure from a chemical compound or from an alloy are those elements which atoms form the chemical compound or alloy. For example, nickel and silicon are the main constituents of a nickel silicide layer and copper and aluminum are the main constituents of a copper aluminum alloy. In addition to the main constituents, the layers and structures may include unintentional impurities due to process imperfections and intentional additives such as dopants.

Figure 1:
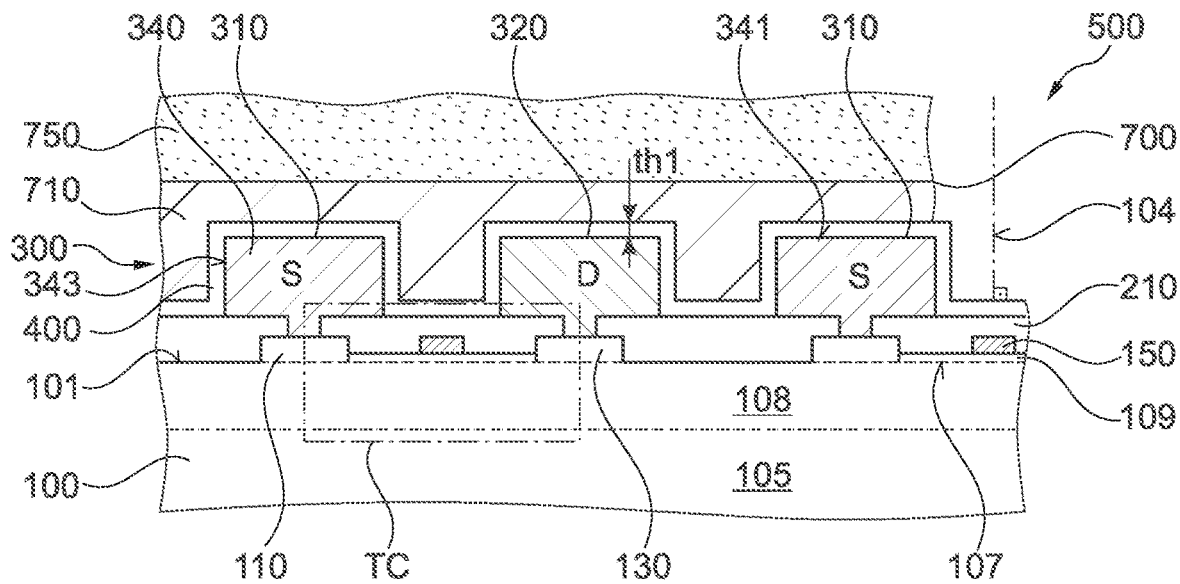
FIG. 1 is a schematic vertical cross-sectional view of a portion of a semiconductor device according to an embodiment related to a copper oxide layer on a top metallization of a semiconductor die.

FIG. 1 shows a semiconductor device 500 with a copper structure 300 formed on a semiconductor body 100 and with a copper oxide layer 400 in direct contact with the copper structure 300.

The semiconductor device 500 may be a power semiconductor device that may be used as a switch or rectifier in power electronics. For example, the semiconductor device 500 may be a semiconductor diode. According to an embodiment the semiconductor device 500 may include a plurality of substantially identical transistor cells TC electrically arranged in parallel. For example, the semiconductor device 500 may be a HEMT (high electron mobility transistor), an IGFET (insulated gate field effect transistor), for example, a MOSFET (metal oxide semiconductor FET) in the usual meaning including IGFETs with metals gates as well as IGFETs with polysilicon gates, a JFET (junction FET), an IGBT (insulated gate bipolar transistor), an MCD (MOS controlled diode), or a smart power semiconductor device that includes CMOS (complementary metal oxide semiconductor) circuits, such as a sensor circuit and/or control circuit in addition to a power semiconductor switch.

The semiconductor body 100 may be based on a semiconductor crystal with one or more main constituents. The main constituent(s) of the semiconductor crystal may be silicon (Si), germanium (Ge), silicon and germanium (SiGe), silicon and carbon (SiC), gallium and nitrogen (GaN), or gallium and arsenic (GaAs), by way of example. The semiconductor body 100 may include further materials, for example, unintentional impurities as a result of material and process imperfections and/or intentional additives, for example, dopant atoms.

The semiconductor body 100 has a first surface 101 at a front side of the semiconductor device 500. Directions parallel to the first surface 101 are horizontal directions. A surface normal 104 to the first surface 101 defines a vertical direction.

The semiconductor body 100 may include semiconducting portions of the transistor cells TC. The transistor cells TC may be planar or vertical MOSFET cells with a MOSFET channel parallel or vertical to the first surface 101 and based on Si or SiC, by way of example.

The illustrated embodiment refers to a HEMT, wherein the semiconductor body 100 may include a channel layer 108 formed on a substrate 105 and a supply layer 109 formed between the first surface 101 and the channel layer 108. The materials of the channel layer 108 and the supply layer 109 have different band gaps and the channel layer 108 and the supply layer 109 form a heterojunction 107. For example, the channel layer 108 may include undoped GaN and the supply layer 109 may include AlGaN or AlN, by way of example. A two-dimensional electron gas may form in the channel layer 108 along the heterojunction 107.

The transistor cell TC may include a heavily doped source region 110 forming an ohmic contact with the channel layer 108. A heavily doped drain region 130 may form another ohmic contact with the channel layer 108. A conductive gate electrode 150 may be formed in contact with the supply layer 109 between the source region 110 and the drain region 130. A potential applied to the gate electrode 150 may control a current flow between the source region 110 and the drain region 130 along the heterojunction 107.

A copper structure 300 on the front side of the semiconductor device 500 may include a wiring/pad structure 340, wherein the wiring/pad structure 340 may include source electrodes 310 electrically connected to the source regions 110 and drain electrodes 320 electrically connected to the drain regions 130. The wiring/pad structure 340 may also include a gate pad electrically connected to the gate electrodes 150. The copper structure 300 may be formed mainly from copper or from a copper alloy with a comparatively high copper content, for example aluminum bronze (CuAl) with an aluminum content by weight in a range from 4% to 12% and the remaining mass exclusively or mainly being copper. A copper structure 300 from aluminum bronze may include further alloying agents such as iron, nickel, manganese, and/or silicon, by way of example.

An interlayer dielectric 210 between the copper structure 300 and the semiconductor body 100 may separate the copper structure 300 from other doped regions in the semiconductor body 100. The interlayer dielectric 210 may include silicon oxide, silicon nitride, a doped glass or any combination thereof, by way of example.

A copper oxide layer 400 is formed on the wiring/pad structure 340. The copper oxide layer 400 may have a thickness of at least 50 nm and may be significantly thicker than a native oxide layer which forms with a thickness of typically of about 5 nm. For example, the copper oxide layer 400 may have a thickness of at least at least 70 nm.

The copper oxide layer 400 includes significantly more copper than a cupric oxide (CuO) layer. The content of copper in the copper oxide layer 400 may be between 60 at % and 75 at %, wherein the content of oxygen may be between 25 at % and 40 at %. For example, the copper content may be at most 70 at % and the oxygen content may be at least 30 at %. The copper oxide layer 400 may include at least 90 wt % cuprous oxide ($Cu_2O$) or may include cuprous oxide doped with copper such that the copper content may slightly exceed 66.7 at %.

The copper oxide layer 400 may be formed by electrochemical deposition. Electrochemical deposition forms a comparatively dense copper oxide layer 400 that covers the top surface 341 and side surface 343 of the wiring/pad structure 340 at high uniformity and with high step coverage. Since the lattice constant of cuprous oxide approximates to the lattice constant of copper, the copper oxide layer 400 may show strong adhesion to the copper structure 300. The presence of both negatively charged oxygen atoms and positively charged copper atoms at the surface of the copper oxide layer 400 may form a stoichiometric layer with strong adhesion to polymers in subsequently deposited materials, e.g., in a polyimide layer or in a mold compound. Since cuprous oxide may be semiconducting, the copper oxide layer 400 may moderate high electric fields between adjacent portions of the copper structure 300 that are electrically connected to different electrical potentials, for example, between the source electrodes 310 and the drain electrodes 320 of the transistor cells TC.

Portions of the copper structure 300 may be electrically connected to each other within the semiconductor device 500 and may be externally separated by material of finite ionic conductivity, wherein ionic contaminants and moisture in a dielectric structure 700 covering the copper structure 300 may cause ionic conduction.

Ionic conduction may result in that portions of the copper structure 300 on the front side of the semiconductor device 500 may form anodes, where metal dissolute. Solute metal cations may form different precipitates resulting from chemical reaction of the metal cations with anions contained in the ionic conduction. Alternatively or in addition, other portions of the copper structure 300 may be effective as cathodes, where metal cations may capture electrons and metallic dendrites may form that extend outwardly from the concerned portion of the copper structure 300. Metallic dendrites reaching a portion of the copper structure 300 effective as anode may result in a short circuit and in a complete failure of the semiconductor device 500.

Typically, a copper metallization may include a passivation layer stack including a silicon oxide layer with a thickness of more than 200 nm and a silicon nitride layer with a thickness of at least 40 nm. Passivation layer stacks may also include $Al_2O_3$. Formation of passivation layers may include PECVD (plasma enhanced chemical vapor deposition). Passivation layer stacks can be prone to cracking and deposition defects, for example, along edges and topology steps. Sections of the passivation layer stacks are typically removed to facilitate interconnections, e.g., wire bonding to the copper metallization. Portions of the copper metallization exposed by removal of the passivation layer stack and other portions of the copper metallization may be left with insufficient protection such that subsequently deposited polymer materials such as polyimide or mold compounds may get in direct contact with the copper structure 300. In the presence of high electric fields, high temperatures and moisture such deposited polymer materials may degrade and may pave the way to corrosion of the copper surface.

The copper oxide layer 400 blocks the ionic conductive connection. Compared to PECVD deposited corrosion-protection layer stacks, the copper oxide layer 400 shows significantly better edge coverage, better uniformity and better adhesion to the copper surface. The copper oxide layer 400 may be provided without using highly toxic substances such as hexavalent chromium. The copper oxide layer 400 may completely separate the copper structure 300 from a dielectric structure 700 that may comprise polymers.

The semiconducting properties of cuprous oxide may mitigate electric field peaks between laterally adjacent copper structures connected to different electric potentials, e.g., the source electrodes 310 and the drain electrodes 320 at the front side of a GaN HEMT. In combination with the high step coverage of electroplated cuprous oxide, the copper oxide layer 400 facilitates densely packed copper source electrodes and copper drain electrodes for high voltage semiconductor devices, e.g., GaN HEMTs. For example, a lateral distance between a source electrode 310 and a drain electrode 320 of a GaN HEMT with a nominal blocking voltage of 600 V may be smaller than 10 μm.

The dielectric structure 700 may include a dielectric layer 710 that may cover portions of the copper structure 300 with the copper oxide layer 400 and that may fill spaces between adjacent portions of the copper structure 300. According to an embodiment the dielectric layer 710 may include a polymer, for example a polyimide. The dielectric layer 710 may further contain reducing agents or agents that are capable of incorporating hydrogen ions into complexes. For example, the reducing agent may include an alkaline buffer and/or anti-corrosive pigments such as carbonite buffer, ZnO and/or $Zn_3(PO_4)_2$ that provide a slightly alkaline environment over a long period of time. Since the cuprous oxide is stable in slightly alkaline environment, a dielectric layer 710 with the described buffer system for hydrogen ions may significantly improve device reliability.

Figure 2:
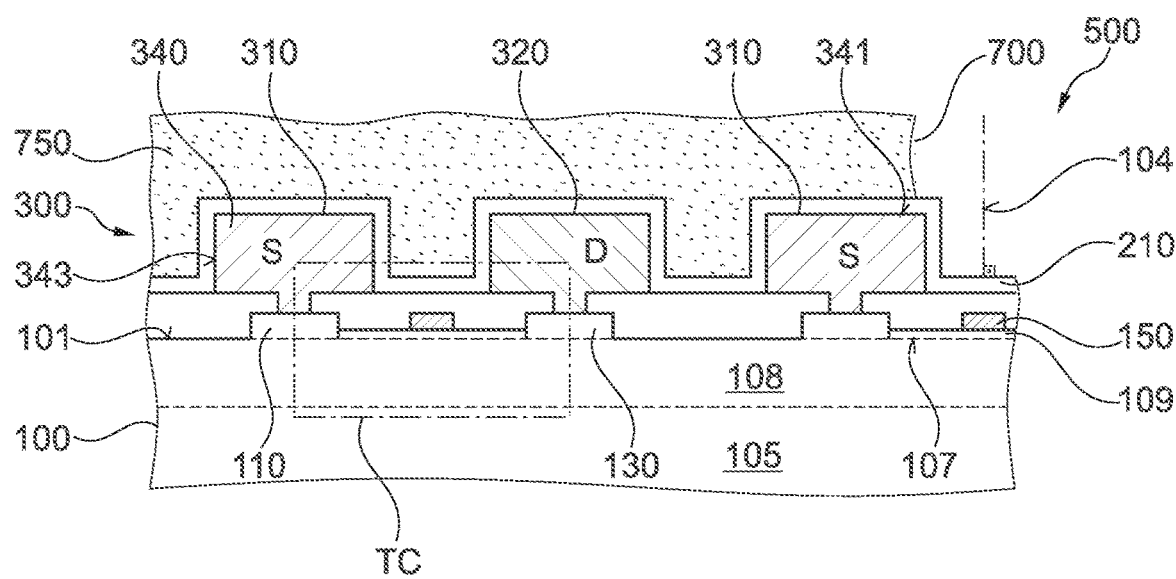
FIG. 2 is a schematic vertical cross-sectional view of a portion of a semiconductor device according to an embodiment related to a mold providing an alkaline environment for a copper oxide layer.

FIG. 2 shows a dielectric structure 700 with a mold 750 in direct contact with the copper oxide layer 400. The mold 750 may fill spaces between adjacent portions of the copper structure 300. The mold 750 may be based on a mold compound that may include meltable organic resin, for example, an epoxy resin and non-melting inorganic filler materials. The mold compound may include catalysts accelerating the cure reaction of the mold compound, flame retardants, adhesion promoters, and/or stress relieving materials. According to an embodiment the mold compound may further include a buffer system that consumes hydrogen ions, for example anticorrosion pigments, e.g., a carbonite buffer, ZnO, and/or $Zn_3(PO_4)_2$.

Figure 3:
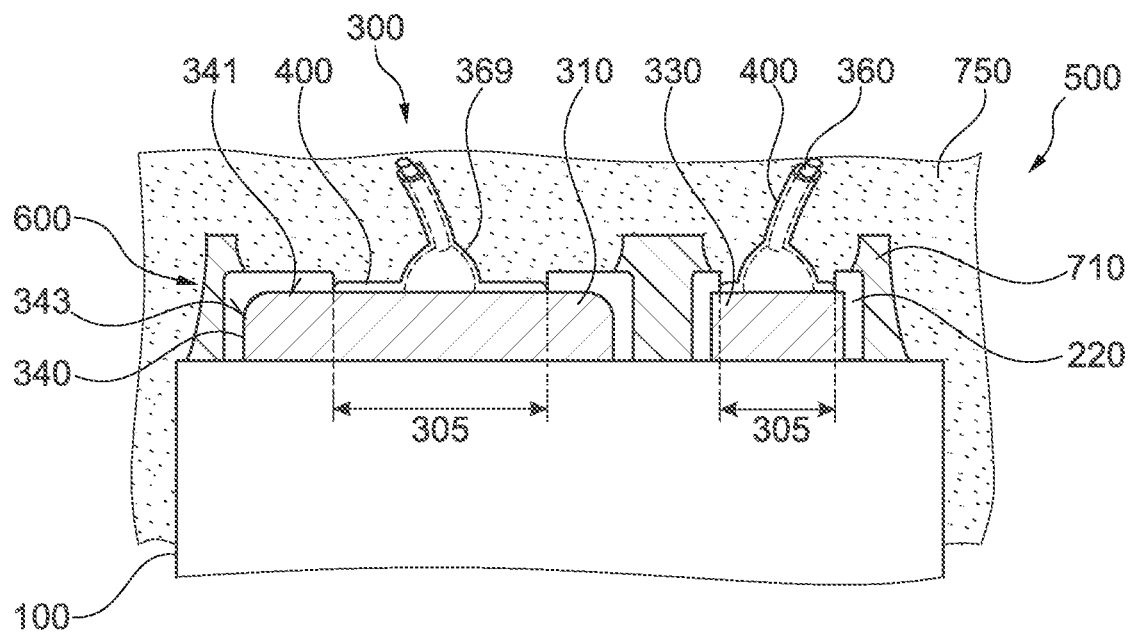
FIG. 3 is a schematic vertical cross-sectional view of a portion of a semiconductor device according to an embodiment related to a copper oxide layer on a bond wire.
Figure 4:
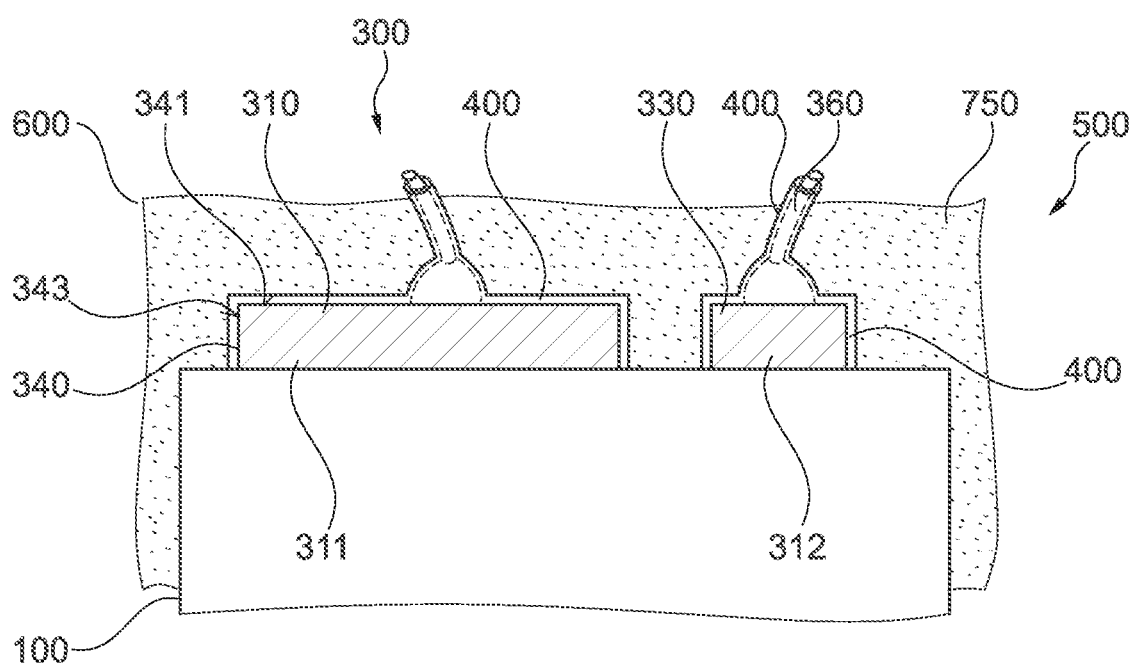
FIG. 4 is a schematic vertical cross-sectional view of a portion of a semiconductor device according to an embodiment related to a copper oxide layer on bond wires and on a top metallization.

The semiconductor devices 500 in FIGS. 3 and 4 may be vertical power semiconductor devices with a load current flow between a source electrode 310 at a front side of the semiconductor device 500 and a drain side metallization at the rear side.

A wiring/pad structure 340 at a front side of the semiconductor device 500 may include a source electrode 310 and a gate pad 330 spatially and electrically separated from the source electrode 310.

A passivation structure 220 may cover side surfaces 343 and portions of the top surface 341 of the source electrode 310 and the gate pad 330 outside bonding areas 305. The passivation structure 220 may include a silicon oxide layer, a silicon nitride layer, an alumina layer or a layer stack including at least two of a silicon oxide layer, a silicon nitride layer and an alumina layer.

A dielectric layer 710 may cover portions of the wiring/pad structure 340 with the passivation structure 220 and may fill spaces between adjacent portions of the wiring/pad structure 340. The dielectric layer 710 may include a polymer, for example, a polyimide.

A copper structure 300 includes bond wires 360. In the following, the term bond wire 360 includes copper clips with a thickness of at least 50 μm and a rectangular cross-sectional area of at least 0.5 $mm^2$. The bond wires 360 may include first wire ends 369 that are in direct contact with first sections of the bonding areas 305 of the source electrode 310 and the gate pad 330.

A copper oxide layer 400 is directly formed on the bond wire 360 and on second sections of the bonding area 305 spared and not occupied by the wire ends 369. The copper oxide layer 400 may be formed by electrochemical deposition after wire bonding and prior to molding and forms a contiguous structure covering and enwrapping the bond wires 360 and covering directly adjacent surface sections of the wiring/pad structure 340 at uniform thickness. In particular, the copper oxide layer 400 does not show gaps around the wire ends 369.

In FIG. 4 the copper structure 300 includes both the wiring/pad structure 340 and the bond wires 360 connected to the wiring/pad structure 340. The copper oxide layer 400 forms a contiguous structure covering in uniform thickness bond wires 360, the complete top surface 341 of the wiring/pad structure 340, and side surfaces 343 of the wiring/pad structure 340.

After formation of the copper oxide layer 400 on copper surfaces, e.g., by electrochemical deposition, the copper oxide layer 400 remains closed and no pattern process re-exposes portions of the copper surfaces, e.g., in order to facilitate wire bonding. The copper oxide layer 400 may completely encapsulate all copper surfaces exposed prior to molding and therefore facilitates a continuous corrosion protection coating. In addition, the copper oxide layer 400 may form a surface with high adhesive forces for a mold compound such that the connection between mold 750, bond wire 360 and the semiconductor die 600, which includes the semiconductor body 100 and the copper structure 300, is strong. The mold compound may fill spaces between neighboring portions of the wiring/pad structure 340. The mold compound may include alkaline buffers providing an alkaline environment for the copper oxide layer 400.

Figure 5A:
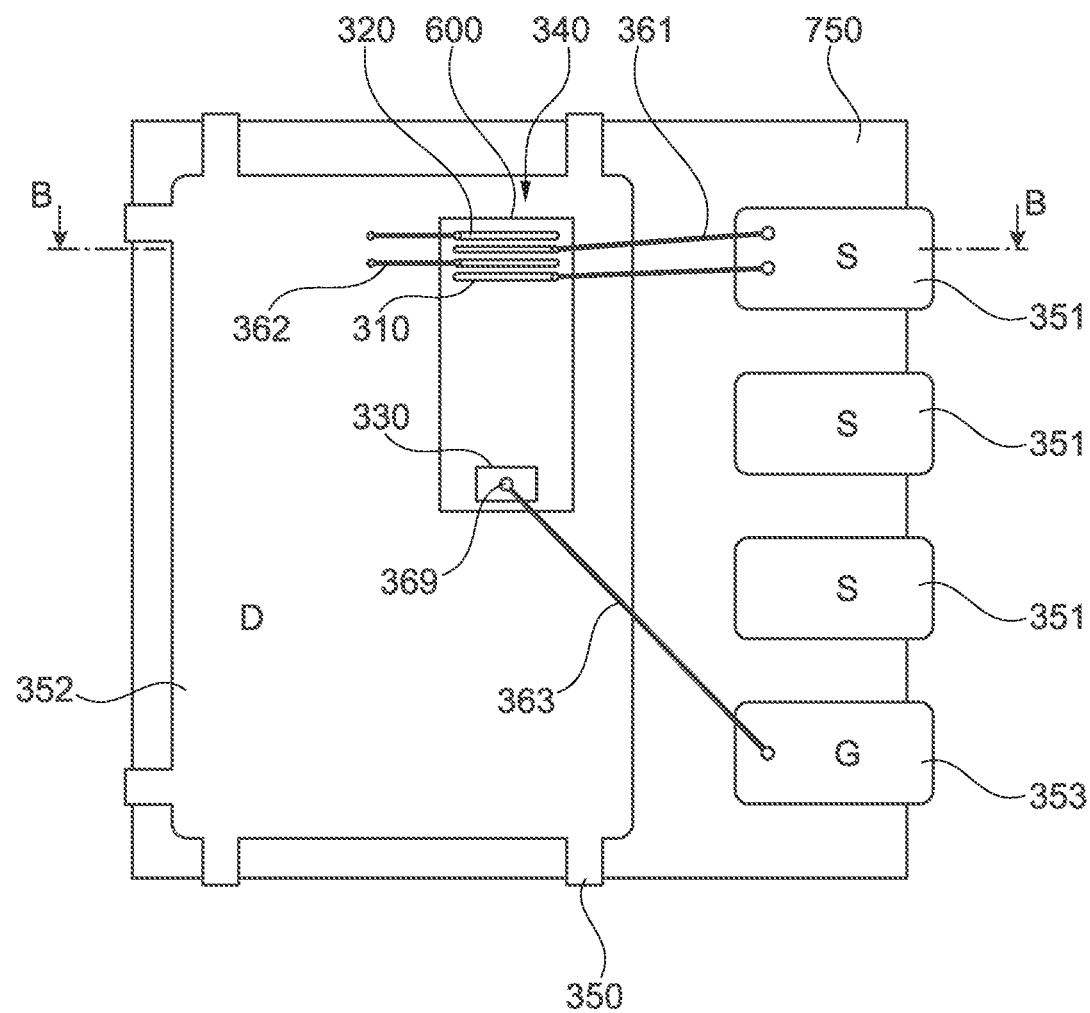
FIG. 5A-5B show a schematic top view and a schematic vertical cross-sectional view of a semiconductor device according to an embodiment related to a copper oxide layer on leads.
Figure 5B:
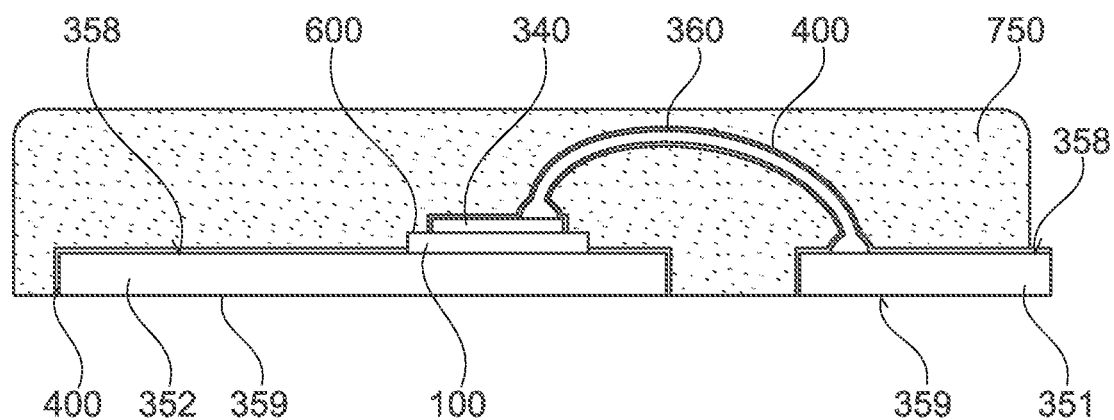

FIGS. 5A to 5B refer to a semiconductor device 500, wherein leads 351, 352, 353 of the semiconductor device 500 may be separated from a lead frame after molding.

A semiconductor die 600 may be mounted, e.g., adhered or bonded on a surface of a drain lead 352. A wiring/pad structure 340 at the front side of the semiconductor die 600 may include drain electrodes 320, source electrodes 310 and a gate pad 330. First bond wires 361 or a copper clip may electrically connect the source electrodes 310 with source leads 351. Second bond wires 362 or a copper clip may electrically connect the drain electrodes 320 with the drain lead 352 and one or more third bond wires 363 may electrically connect the gate pad 330 with a gate lead 353.

A copper oxide layer 400 forms a contiguous layer that may cover the bond wires 361, 362, 363 and/or copper clips, a copper structure 300, which includes a wiring/pad structure 340 at the front side of the semiconductor die 600, and at least first portions 358 of the surface of the leads 351, 352, 353. Second portions 359 of the leads 351, 352, 353 may be formed without a copper oxide layer 400 to ensure high solderability. A mold 750 may encapsulate the bond wires 360 and the semiconductor die 600.

A thickness of the copper oxide layer 400 may be substantially uniform. According to a further embodiment first portions of the copper oxide layer 400 formed on the bond wires 361, 362, 363 may be significantly thinner than second portions of the copper oxide layer 400 on the wiring/pad structure 340 and on the leads 351, 352, 353. For example, formation of the copper oxide layer 400 by electroless galvanic electroplating may result in a thinner copper oxide layer 400 selectively on the bond wires 361, 362, 363.

Figure 6:
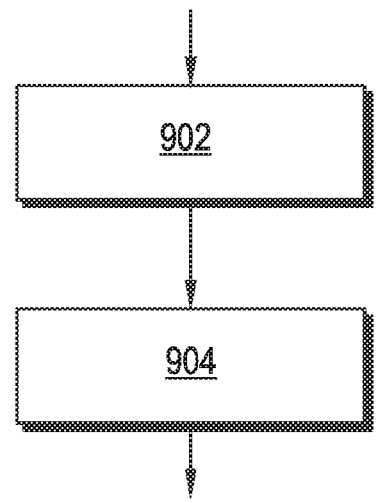
FIG. 6 is a schematic flowchart of a method of manufacturing a semiconductor device according to an embodiment concerning electrochemical deposition of a copper oxide layer on a bond wire.

FIG. 6 refers to a method of manufacturing a semiconductor device. A bond wire including copper is provided, wherein the bond wire electrically connects a semiconductor die with a lead. A copper oxide layer is formed on the bond wire by electrochemical deposition (902). A mold may be formed that may encapsulate the semiconductor die and the bond wire (904).

The electrochemical deposition forms a homogeneous, dense and thin copper oxide layer with a high portion of cuprous oxide. The cuprous oxide effectively inhibits corrosion of the bond wire.

According to an embodiment, also the lead comprises copper such that the copper oxide layer formed by electrochemical deposition extends over at least a first portion of the lead. The copper oxide layer forms an effective anticorrosion layer for both the bond wire and the lead and at the transition between bond wire and lead. The copper oxide layer may be formed after wire bonding and prior to or after separating the leads from a lead frame. According to an embodiment, the copper oxide layer is deposited before separation of the leads from the lead frame.

In the copper oxide layer the content of copper may be between 60 at % and 75 at %, wherein a content of oxygen is between 25 at % and 40 at % and wherein the oxygen contents completes the copper content to 100 at % or at least 99 at %. For example the content of copper is at most 70 at % and the content of oxygen is at least 30 at %. A portion of cuprous oxide in the copper oxide layer may be at least 90 wt %. The copper oxide layer may be a cuprous oxide layer doped with copper.

The copper oxide layer 400 forms an effective anticorrosion layer and forms strong bonds with a mold compound of the mold, wherein the mold compound may include polymers. According to an embodiment the mold compound includes at least one of a reducing agent and an agent capable of forming a hydrogen complex, for example, an alkaline buffer and/or anti-corrosive pigments such as carbonite buffer, ZnO, and/or $Zn_3(PO_4)_2$. The process may be effectively applied during back end processing.

The electrochemical deposition may include applying an electric potential between the copper structure and a solution containing copper ions. The electrochemical reaction may oxidize the copper to stoichiometric cuprous oxide by anodic galvanic deposition. According to another embodiment the deposition forms a deposited cuprous oxide by cathodic galvanic deposition. According to another embodiment the electrochemical deposition includes electroless galvanic electroplating. The solution containing copper ions may be a solution containing copper(II) sulfate, lactic acid and NaOH.

Figure 7:
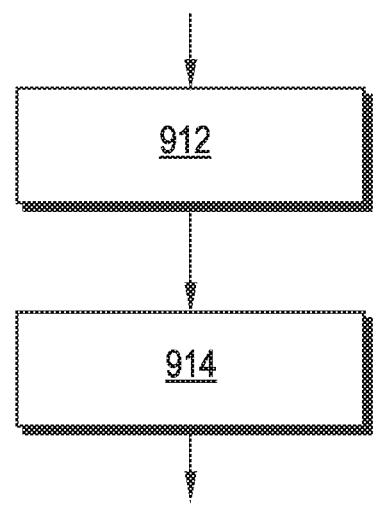
FIG. 7 is a schematic flowchart of a method of manufacturing a semiconductor device according to an embodiment concerning formation of a copper oxide layer with high cuprous oxide content.

FIG. 7 shows a further method of manufacturing a semiconductor device. The method includes providing a copper structure on a semiconductor body (912). A copper oxide layer is formed directly on the copper structure (914), wherein in the copper oxide layer a content of copper is between 60 at % and 75 at %, and a content of oxygen is between 25 at % and 40 at %.

The copper oxide layer may be formed by anodic electrochemical deposition or cathodic electrochemical deposition, wherein a potential is applied between a solution containing copper ions and the copper structure. According to an embodiment, the electrochemical deposition includes an electroless galvanic plating of cuprous oxide. The copper oxide layer may be formed prior to formation of a dielectric structure including polymers, e.g., prior to forming a polyimide layer or prior to forming a mold.

Figure 8:
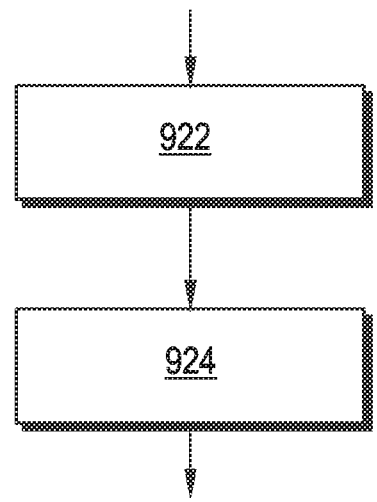
FIG. 8 is a schematic flowchart of a method of manufacturing a semiconductor device according to an embodiment concerning electroless galvanic deposition of a copper oxide layer with a high content of cuprous oxide.

FIG. 8 refers to a further method of manufacturing a semiconductor device. A copper structure is provided (922). A copper oxide layer is formed directly on the copper structure by electroless chemical plating (924). The electroless chemical plating deposits a metal oxide layer from an aqueous solution comprising copper ions on a metallic copper surface without applying an electric potential between the aqueous solution and the copper surface.

For example, a substrate or work piece including the copper structure is dipped into the aqueous solution comprising copper ions, for example, a solution comprising copper(II) sulfate, lactic acid and NaOH. The method facilitates the formation of a copper oxide layer with a plurality of separated portions of the copper structure, for example, the metal lines of semiconductor devices in a wafer assembly.

What is claimed is:

1. A semiconductor device, comprising:
   a semiconductor body;
   a copper structure comprising a wiring/pad structure formed on the semiconductor body, wherein the wiring/pad structure comprises a top surface and a side surface; and
   a copper oxide layer on the top surface and on the side surface of the wiring/pad structure, wherein, in the copper oxide layer, a content of copper is between 60 at % and 75 at %, and a content of oxygen is between 25 at % and 40 at %,
   wherein a thickness of the copper oxide layer is at least 50 nm.

2. The semiconductor device of claim 1, wherein, in the copper oxide layer, a content of cuprous oxide is at least 90%.

3. The semiconductor device of claim 1, further comprising:
   an interlayer dielectric between the wiring/pad structure and the semiconductor body.

4. The semiconductor device of claim 1, wherein the copper structure comprises a bond wire electrically connecting the wiring/pad structure with a lead, and wherein the copper oxide layer is further formed on the bond wire.

5. The semiconductor device of claim 4, wherein the bond wire comprises a wire end in contact with the wiring/pad structure, and wherein the copper oxide layer is formed in a bonding area of the wiring/pad structure around the wire end.

6. The semiconductor device of claim 4, wherein the lead comprises copper and the copper oxide layer is further formed on at least a first portion of the lead.

7. The semiconductor device of claim 1, further comprising:
   a dielectric structure directly on the copper oxide layer, the dielectric structure comprising at least one of a reducing agent and an agent capable of forming a hydrogen-complex.

8. The semiconductor device of claim 7, wherein the dielectric structure comprises anticorrosion pigments.

9. The semiconductor device of claim 7, wherein the dielectric structure comprises polyimide and/or an epoxy resin.

10. The semiconductor device of claim 1, further comprising:
    a transistor cell formed in the semiconductor body, wherein the transistor cell is electrically connected to the copper structure.

11. The semiconductor device of claim 1, wherein:
    the semiconductor body comprises source regions, drain regions, a channel layer, and a supply layer, and
    the copper structure includes source electrodes and drain electrodes, the source electrodes are electrically connected to the source regions, the drain electrodes are electrically connected to the drain regions, the source regions and the channel layer form ohmic contacts, the drain regions and the channel layer form ohmic contacts, and the channel layer and the supply layer form a heterojunction.

12. A semiconductor device, comprising:
    a semiconductor body;
    a copper structure comprising a wiring/pad structure formed on the semiconductor body,
    wherein the wiring/pad structure comprises a top surface, a side surface, and one or more bonding areas each configured as a landing zone for a bond wire; and a copper oxide layer on the top surface and on the side surface of the wiring/pad structure, wherein the copper oxide layer comprises cuprous oxide.

13. The semiconductor device of claim 12, wherein the cuprous oxide is in direct contact with the copper structure.

14. The semiconductor device of claim 12, further comprising:

a dielectric structure directly on the copper oxide layer, the dielectric structure comprising at least one of a reducing agent and an agent capable of forming a hydrogen-complex.

15. A semiconductor device, comprising:

a semiconductor body;

a copper structure comprising a wiring/pad structure formed on the semiconductor body, wherein the wiring/pad structure comprises a top surface and a side surface; and a copper oxide layer on the top surface and on the side surface of the wiring/pad structure, wherein, in the copper oxide layer, a content of copper is between 60 at % and 75 at %, and a content of oxygen is between 25 at % and 40 at %, wherein the copper structure comprises a bond wire electrically connecting the wiring/pad structure with a lead, wherein the copper oxide layer is further formed on the bond wire.

16. The semiconductor device of claim 15, wherein the bond wire comprises a wire end in contact with the wiring/pad structure, and wherein the copper oxide layer is formed in a bonding area of the wiring/pad structure around the wire end.

17. The semiconductor device of claim 15, wherein the lead comprises copper and the copper oxide layer is further formed on at least a first portion of the lead.

* * * * *